United States Patent
Vetter

(10) Patent No.: US 7,357,975 B2
(45) Date of Patent: Apr. 15, 2008

(54) CARBON-CONTAINING HARD COATING AND A METHOD FOR DEPOSITING A HARD COATING ONTO A SUBSTRATE

(75) Inventor: Joerg Vetter, Bergisch Gladbach (DE)

(73) Assignee: Metaplas Ionon Oberflachenveredelungstechnik GmbH, Bergisch Gladbach (DE)

(*) Notice: Subject to any disclaimer, the term of this patent is extended or adjusted under 35 U.S.C. 154(b) by 0 days.

(21) Appl. No.: 11/077,225

(22) Filed: Mar. 9, 2005

(65) Prior Publication Data

US 2005/0201921 A1    Sep. 15, 2005

(30) Foreign Application Priority Data

Mar. 12, 2004   (EP) ................... 04405146

(51) Int. Cl.
*B32B 16/00* (2006.01)

(52) U.S. Cl. ............... 428/216; 106/286.1; 106/286.2; 106/286.7; 106/286.8; 428/336; 428/698; 428/699; 427/249.17; 427/450; 204/192.1; 204/192.15

(58) Field of Classification Search ............ 106/286.1, 106/286.2, 286.3, 286.4, 286.5, 286.6, 286.7, 106/286.8; 428/698, 216, 336, 699; 204/192.1, 204/192.15; 427/950, 249.17
See application file for complete search history.

(56) References Cited

U.S. PATENT DOCUMENTS

| 5,580,653 | A | 12/1996 | Tanaka et al. | |
| 6,767,658 | B2 * | 7/2004 | Yamamoto et al. | 428/698 |
| 6,824,601 | B2 * | 11/2004 | Yamamoto et al. | 106/286.2 |

2003/0143402 A1   7/2003   Hon et al.

FOREIGN PATENT DOCUMENTS

| EP | 0447556 A1 | | 9/1991 |
| EP | 0701982 A1 | | 3/1996 |
| EP | 0709353 A2 | | 5/1996 |
| EP | 0709483 A2 | * | 5/1996 |
| EP | 1316627 A1 | | 6/2003 |
| JP | 09-323204 | * | 12/1997 |
| JP | 2000-326108 | * | 11/2000 |
| JP | 2001-234328 | * | 8/2001 |
| JP | 2002-003284 | * | 1/2002 |
| JP | 2003145317 | | 5/2003 |
| JP | 2004-034186 | * | 2/2004 |

OTHER PUBLICATIONS

Stan Veprek; "The search for novel, superhard materials;" *J. Vac. Sci. Technol. A*; Sep./Oct. 1999; pp. 2401-2420; vol. 17; No. 5; American Vacuum Society.

Stueber et al., Multifunctional nanolaminated PVD coatings in the system Ti-Al-N-C by combination of metastable fcc phases and nanocomposite microstructures, Surface & Coatings Technology; 2006; vol. 200 pp. 6162-6171.

* cited by examiner

*Primary Examiner*—Archene Turner
(74) *Attorney, Agent, or Firm*—Townsend and Townsend and Crew LLP

(57) ABSTRACT

The carbon-containing hard coating (1) according to the invention comprises nano-crystalline grains being separated from each other by grain boundaries, wherein said hard coating comprises aluminum (Al), at least one additional metal (Me1, Me2), carbon (C) and at least one further element (E1, E2) and has the chemical composition:

$$(Al_xMe1_yMe2_z)C_uE1_vE2_w$$

wherein Me1 is a metal, and Me2 is a metal, with $x>0.4$ and $x+y+z=1$ and $y,z \geq 0$, and E1 and E2 are further chemical elements with $1>u>0$ and $u+v+w=1$ and $v,w \geq 0$. The grain boundaries have a higher concentration of carbon atoms than the nano-crystalline grains.

34 Claims, 3 Drawing Sheets

Fig.1

| Table 1 | | composition | nano-crystalline grains ratio of carbon content | grain size (nm) | Raman FWHV (cm-1) | structure | number of layers | FWHV(200) (deg.) | I(200)/I(111) | life(hole) |
|---|---|---|---|---|---|---|---|---|---|---|
| | 1 | (Al$_{52}$Ti$_{48}$)(N$_{61}$C$_{37}$O$_2$) | 1.5 | 4 | 46 | A to B(C to D) | 520 | 1.5 | 3.8 | 3465 |
| | 2 | Al$_{50}$Ti$_{50}$N/(Al$_{52}$Ti$_{48}$)(N$_{61}$C$_{37}$O$_2$) | 1.6 | 6 | 51 | A to B(C to D) | 520 | 1.5 | 5.2 | 3466 |
| | 3 | (Al$_{52}$Ti$_{48}$)(N$_{61}$C$_{37}$O$_2$) | 1.1 | 8 | 33 | A to B(C to D) | 520 | 1.2 | 3.9 | 2772 |
| | 4 | (Al$_{52}$Ti$_{48}$)(N$_{61}$C$_{37}$O$_2$) | 1.1 | 6 | 46 | B | 1 | 1.0 | 6.0 | 2970 |
| | 5 | (Al$_{52}$Ti$_{48}$)(N$_{61}$C$_{37}$O$_2$) | 1.5 | 3 | 55 | A to B | 2 | 1.4 | 4.8 | 3168 |
| | 6 | (Al$_{52}$Ti$_{48}$)(N$_{61}$C$_{37}$O$_2$) | 1.5 | 3 | 55 | A to B(C to D) | 1500 | 1.4 | 4.8 | 3069 |
| | 7 | (Al$_{52}$Ti$_{48}$)(N$_{61}$C$_{37}$O$_2$) | 1.5 | 4 | 46 | A to B(C to D) | 520 | 1.5 | 1.2 | 2772 |
| | 8 | (Al$_{52}$Ti$_{48}$)(N$_{61}$C$_{37}$O$_2$) | 1.5 | 4 | 32 | A to B(C to D) | 520 | 1.5 | 3.8 | 3663 |
| | 9 | (Al$_{52}$Ti$_{48}$)(N$_{61}$C$_{37}$O$_2$) | 1.5 | 3 | 28 | A to B(C to D) | 520 | 1.5 | 3.8 | 3465 |
| | 10 | (Al$_{52}$Ti$_{48}$)(N$_{61}$C$_{37}$O$_2$) | 1.5 | 4 | 46 | A to B(C to D) | 520 | 1.5 | 3.8 | 3861 |
| | 11 | (Al$_{62}$Ti$_{25}$Cr$_{13}$)(N$_{61}$C$_{37}$O$_2$) | 1.5 | 4 | 46 | A to B(C to D) | 520 | 1.2 | 3.9 | 4158 |
| | 12 | (Al$_{62}$Ti$_{25}$Cr$_{13}$)(N$_{61}$C$_{37}$O$_2$) | 1.5 | 2 | 45 | A to B(C to D) | 700 | 1.2 | 3.9 | 4322 |
| | 13 | (Al$_{60}$Ti$_{35}$Nb$_5$)(N$_{61}$C$_{37}$O$_2$) | 1.7 | 2 | 77 | A to B(C to D) | 520 | 1.8 | 2.8 | 4059 |
| | 14 | (Al$_{63}$Ti$_{37}$)(N$_{35}$C$_{60}$O$_5$) | 1.8 | 4 | 82 | A to B(C to D) | 520 | 1.8 | 4.4 | 3281 |

CARBON-CONTAINING HARD COATING AND A METHOD FOR DEPOSITING A HARD COATING ONTO A SUBSTRATE

BACKGROUND OF THE INVENTION

The invention relates to a carbon-containing hard coating as well as to a method for depositing a hard coating onto a substrate.

In a variety of important applications, e.g. in the field of cutting tools for milling, turning, or drilling, in the case of molds or mechanical components like bearings, dies, rolls, or for example in the wide range of engine-components, it is popular to coat hard coatings onto stressed surfaces in order to have superior wear resistance, oxidation behavior, and friction properties.

Hard coatings containing titanium nitride are widely spread in a great variety of applications, wherein by adding carbon and aluminum forming $Ti_xAl_yN_z$ and/or $Ti_xC_yN_z$ chemical compounds, the hardness of titanium nitride coatings may be increased due to enhanced chemical bonding. In addition, the aforementioned MeCN compounds may be embedded into an amorphous-carbon phase reducing the friction coefficient of the hard coating. Furthermore, it is well known that TiAlN has better oxidation resistance than TiN as a consequence of the formation of an aluminum passivation layer on the surface.

In particular in the field of high-speed-machining, high frictional forces arise, especially if coated parts are pressed against each other by great forces causing additionally high temperatures as well as enormous longitudinal and transversal mechanical stress in the coating. The problem is that known conventional hard coatings do not have at the same time a sufficient wear resistance and a low friction coefficient, especially at higher temperatures, so that strong abrasion damages are caused in the coating after only a short time of operation.

SUMMARY OF THE INVENTION

It is therefore an object of the invention to provide an improved carbon-containing hard coating as well as a method for depositing such a hard coating onto a surface of a substrate, which hard coating has very high hardness, a low friction coefficient, high ductility and simultaneously an excellent strength against flaking-off and at the same time showing remarkably reduced residual stress, even at high temperatures.

The subject matter of the invention which satisfies this object is characterized by the features of the independent claims of the respective category.

The respective subordinate claims relate to particularly advantageous embodiments of the invention.

The carbon-containing hard coating according to the invention comprises nano-crystalline grains being separated from each other by grain boundaries, wherein the hard coating comprises aluminum, at least one additional metal, carbon and at least one further element and has the chemical composition:

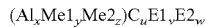

$(Al_xMe1_yMe2_z)C_uE1_vE2_w$ wherein Al is aluminum, Me1 is a metal, and Me2 is a metal, with x>0.4 and x+y+z=1 and y,z≧0, and C is carbon and E1 and E2 are further chemical elements with 1>u>0 and u+v+w=1 and v,w≧0. The grain boundaries have a higher concentration of carbon atoms than the nano-crystalline grains.

The hard coating according to the invention has a high hardness and is remarkably improved in low residual stress, has excellent strength against flaking-off and shows high reduction of stress relief of residual compression stress under high temperature, because carbon is not simply added to the hard coating but carbon is enriched at the grain boundaries of the nano-crystalline grains; that is, the nano-crystalline grains are not simply embedded into an amorphous-carbon phase as known from the state of the art. The carbon content in the grain boundaries is adjusted by controlling the pressure in the coating chamber and the temperature of the substrate to be coated, by controlling the kinetic energy of ions in the course of the coating process as well as by controlling the supply of carbon.

In addition, the hard coating in accordance with the present invention also has superior anti-oxidation properties due to the fact that the crystal grains are very fine; that is, they are of small size with a characteristic diameter of less than 50 nm, whereby in the context of this patent application, the term "characteristic diameter" refers to the diameter of a circle area which is calculated from a cross-sectional area of the grains.

It is a new and surprising finding of the invention that an atomic concentration of aluminum greater than 0.4 with respect to the entire metal content results in improved properties of the hard coating in accordance with the invention, that is, e.g., that the hard coating has improved friction properties and excellent strength against flaking-off. A very low friction coefficient of the coating is achieved because the grain boundaries are highly enriched with carbon resulting in an excellent self-lubricating behavior.

According to a preferred embodiment, in Raman spectrum analysis the full width at half maximum of the Raman-lines between 1700 $cm^{-1}$ and 1000 $cm^{-1}$ is less than 150 $cm^{-1}$, preferably less than 100 $cm^{-1}$, which is especially, but not necessarily, restricted to the case for hard coatings comprising metal carbo-nitride and/or carbo-oxi-nitride.

In a first preferred embodiment, the hard coating includes a metal carbo-oxide which is a chemical compound including at least one metal, carbon, and oxygen in which E1 is oxygen and v>0.

In a second embodiment, the hard coating according to the invention includes a metal carbo-nitride, which is a chemical compound including at least one metal, carbon, and nitrogen in which E2 is nitrogen and w>0.

It is understood that in a special embodiment the hard coating may include a metal carbo-oxi-nitride, which is a chemical compound comprising at least one metal, carbon, oxygen and nitrogen.

The chemical component Me1 and/or Me2 may be an element of the $3^{rd}$ or $4^{th}$ main-group of the periodic table of the elements, and is especially boron and/or silicon, or a lanthanide; in particular, Me1 and/or Me2 may be a transition metal, especially iron and/or copper and/or chromium and/or manganese and/or scandium and/or yttrium and/or lanthanum and/or molybdenum and/or tungsten and/or titanium and/or niobium and/or vanadium and/or tantalum and/or zirconium and/or hafnium.

In a further embodiment of a hard coating according to the invention the chemical compound E1 and/or E2 is lithium and/or beryllium and/or an element of the $6^{th}$ or $7^{th}$ main-group of the periodic table of the elements, especially sulphur and/or fluorine and/or chlorine.

In a preferred embodiment, the nano-crystalline grains in the hard coating according to the invention have a cubic structure, especially a cubic-face-centred structure, and/or have a hexagonal structure, especially a minor-hexagonal structure, whereby in the context of this patent application the term "minor-hexagonal structure" refers to a crystallographic structure being essentially of cubic structure with small regions of hexagonal structure.

A characteristic diameter of the nano-crystalline grains is greater than 1 nm and less than 50 nm, preferably greater than 2 nm and less than 10 nm.

The cubic face-centred structure of the nano-crystalline grains can be clearly identified in electron-diffraction patterns taken by the well-known transmission-electron-microscopy technique.

In contrast, the grain boundaries by which the nano-crystalline grains are separate from each other are substantially of highly disordered structure resulting in typical electron-diffraction patterns showing broad and essentially unstructured diffraction lines, whereby the highly disordered grain boundaries may also include more or less ordered substructures.

Preferably but not necessarily, the hard coating of the present invention has a multi-layer structure including at least 2 layers and at the most 2000 layers wherein the thickness of each layer is at least 2 nm and at the most 2000 nm.

Regarding a special embodiment, the multi-layer structure includes an A-layer and a B-layer wherein the A-layer has a lower atomic concentration of carbon than the B-layer.

Furthermore, the B-layer may have a multi-layer structure including a C-layer and a D-layer wherein the C-layer has a lower atomic concentration of carbon than the D-layer, wherein the thickness of each of the C-layer and the D-layer is at least 2 nm and at the most 100 nm.

In another embodiment, the hard coating includes at least one layer and one amorphous-like top-layer with a higher atomic concentration of carbon than the layer. In a special variation, the aforementioned layer includes at least 15% of carbon and at the most 75% of carbon, measured in atomic percent of non-metallic elements included in the hard coating.

Taking x-ray patterns of the hard coating in accordance with the invention, the full width at half maximum of the $(200)_x$-ray diffraction peak caused by an (200)-plane is at least 1° and at the most 4° at $2\theta$, especially at least 1.2° and at the most 1.90 at $2\theta$, wherein the value of an (200)-intensity (I[200]) of an (200)-peak caused by an (200)-plane, and an (111)-intensity (I[111]) of the (111)-peak caused by an (111) plane, has preferably an intensity-ratio I[200]/I[111] of at least 1 and at the most of 15.

According to the invention, a method for depositing a hard coating is suggested, wherein the method is a physical-vapor-deposition technique, where the atomic concentration of carbon in the hard coating is preferably controlled by varying the flow rate of an oxygen- and/or carbon-containing gas, for example $C_2H_2$, in the course of the coating process.

A preferred method for depositing the hard coating is to sputter the hard coating onto a substrate by using a carbon-containing sputter-target which is, in particular, very effective if an extremely low friction resistance of the hard coating is desired.

A combination of the aforementioned coating techniques, that is, controlling the carbon content by varying the flow rate of a carbon including gas and, at the same time, using a carbon containing sputter-target, is also favorable.

It is also favorable to introduce argon into the coating chamber to generate argon ions through plasma glow discharge to clean the substrate by argon ion emission.

The carbon content in the grain boundaries can be adjusted for instance by controlling the pressure in the coating chamber, by controlling the kinetic energy of ions in the course of the coating process, or by controlling the supply of carbon. Additionally, the temperature of the substrate to be coated may be adjusted by heating the substrate to a certain temperature, e.g. to a temperature between 550° C. and 650° C., especially to a temperature of 575° C.

In a special embodiment, a cathodic vacuum arc-evaporation method is used wherein, before starting the coating process, the substrate is cleaned and preheated by bombarding the surface of the substrate with ions. Preferably, a protective atmosphere comprising argon and/or oxygen is present in the coating chamber. In the course of the coating process the temperature of the substrate is adjusted to a temperature between 500° C. and 650° C., preferably to about 575° C. The substrate is biased by a substrate power supply to a voltage in the range of 20V to 200V and the cathode current is in the range between 30 A and 200 A. During the coating process a gas comprising nitrogen and/or $C_2H_2$ is introduced into the coating chamber and the total pressure of the gas in the chamber is maintained in the pressure range between 0.5 Pascal and 5 Pascal. The flow of the gas is varied between 2 $cm^3$/sec (sccm) and 200 $cm^3$/sec (sccm).

Further methods in accordance with the invention for depositing a hard coating onto a substrate are using an arc-plasma-deposition technique and/or using an electron-beam-evaporation technique and/or a chemical-vapor-deposition technique, especially a plasma-enhanced-chemical-vapor-deposition technique. It is understood that every suitable combination of the aforementioned coating techniques may be applied to deposit the hard coating layer onto a substrate, for example to produce coatings having a multi-layer structure, wherein different layers may have different chemical compositions and/or different chemical and/or physical properties.

The above-mentioned coating techniques are all well known to the person skilled in the art and are described in technical standard works and, therefore, need not to be described here in detail.

BRIEF DESCRIPTION OF THE DRAWINGS

In the following, the invention will be explained in more detail with reference to the drawings.

FIG. 1 is Table 1 listing hard coatings according to the invention with different chemical compositions and different properties;

DESCRIPTION OF THE PREFERRED EMBODIMENTS

Figure 2:
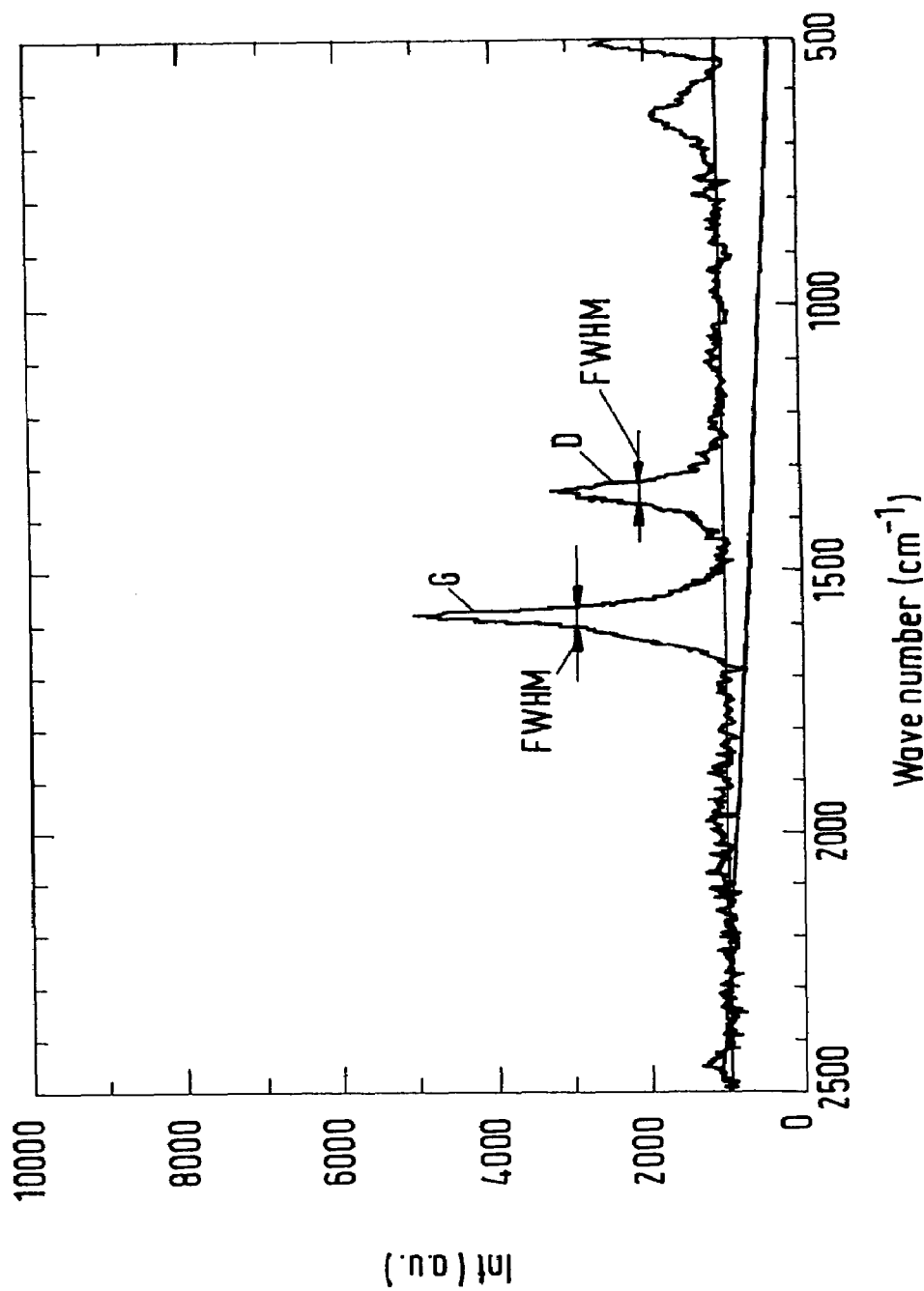
FIG. 2 is a pattern of a Raman spectrum analysis of a hard coating in accordance with the invention.

In FIG. 1 a listing of some examples of hard coatings 1 according to the present invention with different chemical compositions is given by Table 1, all having a multi-layer structure as indicated in the column headed "structure" of Table 1, wherein e.g. B(C to D) means a B-layer having multi-layers of C-layer and D-layer. The number of layers of a given hard coating 1 varies between 1 (example 4) and 1500 (example 6).

According to the invention, the aluminum content of the hard coating 1 is greater than 0.4 with respect to the entire metal content of the hard coating 1. In the examples given in Table 1 the aluminum content in different hard coatings 1 is between 0.50 and 0.63. Please note that the proportion of a respective element in a certain composition in Table 1 is given in percent. That is, for instance, ($Al_{52}Ti_{48}$) means that the composition includes 52% Al and 48% Ti. It is understood that the aluminum content of a hard coating 1 according to the invention can be less than 0.50 or more than 0.63. The examples of hard coatings 1 given in Table 1 are preferred embodiments of the present invention and it is a matter of course that further hard coatings 1 with other chemical compositions and/or chemical and/or physical properties are possible according to the claims and as disclosed in the description.

The carbon content in the grain boundaries is much greater than in the nano-crystalline grains themselves. The column "ratio of carbon content" gives the ratio of the carbon content in the grain boundaries in relation to the carbon content in the nano-crystalline grains. The ratios of carbon content given in Table 1 can be measured by a variety of well-known different methods, for instance, but not limited to, by "electron energy loss spectroscopy", which is a very suitable method, especially for executing analysis of carbon contents in nano-size dimensions. The electron-diffraction patterns taken from the grain boundaries show broad and essentially unstructured diffraction lines.

The results of Raman spectrum analysis shown in column "Raman" give the full width at half maximum (FWHM) of the Raman G-band, having values between 28 $cm^{-1}$ and 82 $cm^{-1}$, which is noticeably less than 100 $cm^{-1}$, which value is remarkably smaller in comparison with known amorphous-like carbon layers. The respective Raman spectrum analyses were executed using an Argon-Ion-Laser equipment providing light of a wave length of 514.5 nm and having an output power of 1 mW and a laser beam diameter of 1 μm.

The full widths at half maximum of the (200)-x-ray diffraction peaks at 2Θ caused by (200)-planes are between 1.0 degree and 1.8 degree and the ratio of the (200)-intensities caused by a (200)-plane and the (111)-intensities caused by a (111) plane have a value between 1.2 and 6.8. The grain size, that is, the characteristic diameter of grains in the respective hard coatings, is for nearly all examples between 2 nm and 8 nm, that is, in most cases noticeably less than 10 nm.

In order to demonstrate the improved properties of the hard coating in accordance with the invention, cutting tests were carried out with dual-cutting edge drills, which drills were provided with a hard coating as indicated in Table 1. A very good measure for the lifetime of a drill is the number of holes which can be machined before the drill loses its cutting ability.

Possible and typical drill cutting conditions which were used to determine the life of drills coated with a hard coating according to the invention are as follows:

Tool: 2-cutting edge drill made of hard metal alloy

Diameter of tool: O.D. 6 mm

Substrate to be coated: WC-10 weight percent Co hard metal alloy

Cutting method: Blind hole machining

Material to be cut: SCM440 Steel DIN 1.7225 (42CrMo4) (30 HRC)

Depth of hole: 18 mm

Cutting speed: 150 m/min.

Feed rate: 0.3 mm/rev

Cutting oil: None. Air blow.

The results of the respective cutting tests are summarized in the column "life (hole)" in Table 1, which gives the number of holes which can be machined by a single drill before the drill loses its cutting ability. The very large number of holes which can be machined by a single drill having a hard coating according to the present invention demonstrates very clearly the high hardness, the excellent strength against flaking-off, and the improved properties under high temperature conditions.

In order to demonstrate the improved properties of the hard coating in accordance with the invention in comparison with the properties of a conventional hard coating known from the state of the art, a drill was coated by such a conventional hard coating having the chemical composition ($Al_{52}Ti_{48}$)($N_{61}C_{37}O_2$) and having in the grain boundaries the same carbon content as in the nano-crystalline grains themselves. That is, the "ratio of carbon content" which gives the ratio of the carbon content in the grain boundaries in relation to the carbon content in the nano-crystalline grains equals 1. The structure of the aforementioned conventional coating is an "A to B (C to D)" multi-layer structure comprising 520 layers and the full width at half maximum of the (200)-x-ray diffraction peaks at 2Θ is 1.5 degree and the ratio of the (200)-intensity to the (111)-intensity is 3.8.

That is, with respect to the total chemical composition, the multi-layer-structure, and the above-mentioned crystallographic properties of the nano-grains themselves, the aforementioned coating is similar to the hard coating in accordance with the invention given in example 1 of Table 1.

The deciding difference between the known conventional coating and the hard coating in accordance with the invention is the very different carbon ratio as discussed above, causing completely different properties of the respective coating.

The number of holes which can be machined by a single drill having the conventional coating is only about 1200 holes before the drill loses its cutting ability. This is much less than the number of holes which can be machined by a drill having a hard coating in accordance with the invention. As very clearly indicated in Table 1, due to the improved properties of the hard coating of the present invention, that is, especially due to the very high hardness, the excellent strength against flaking-off, and the improved resistance under high temperature conditions, the number of holes which can be machined by a hard-coated drill amounts to between 2772 and 4322 holes; that is, the lifetime of the drill can be significantly increased in comparison to the lifetime of a drill which has a conventional coating known from the state of the art.

In FIG. 2 a typical pattern of a Raman spectrum analysis of a hard coating 1 in accordance with the invention without an amorphous-like top-layer T is presented. The two narrow, well-separated lines G, D which are well known to the skilled person as the G-band and D-band, respectively, are due to the nano-crystalline grains and prove their regular crystalline structure. Thus, the Raman spectrum analysis demonstrates clearly that nano-crystalline carbon grains are present in the hard coating in accordance with the invention.

Figure 3:
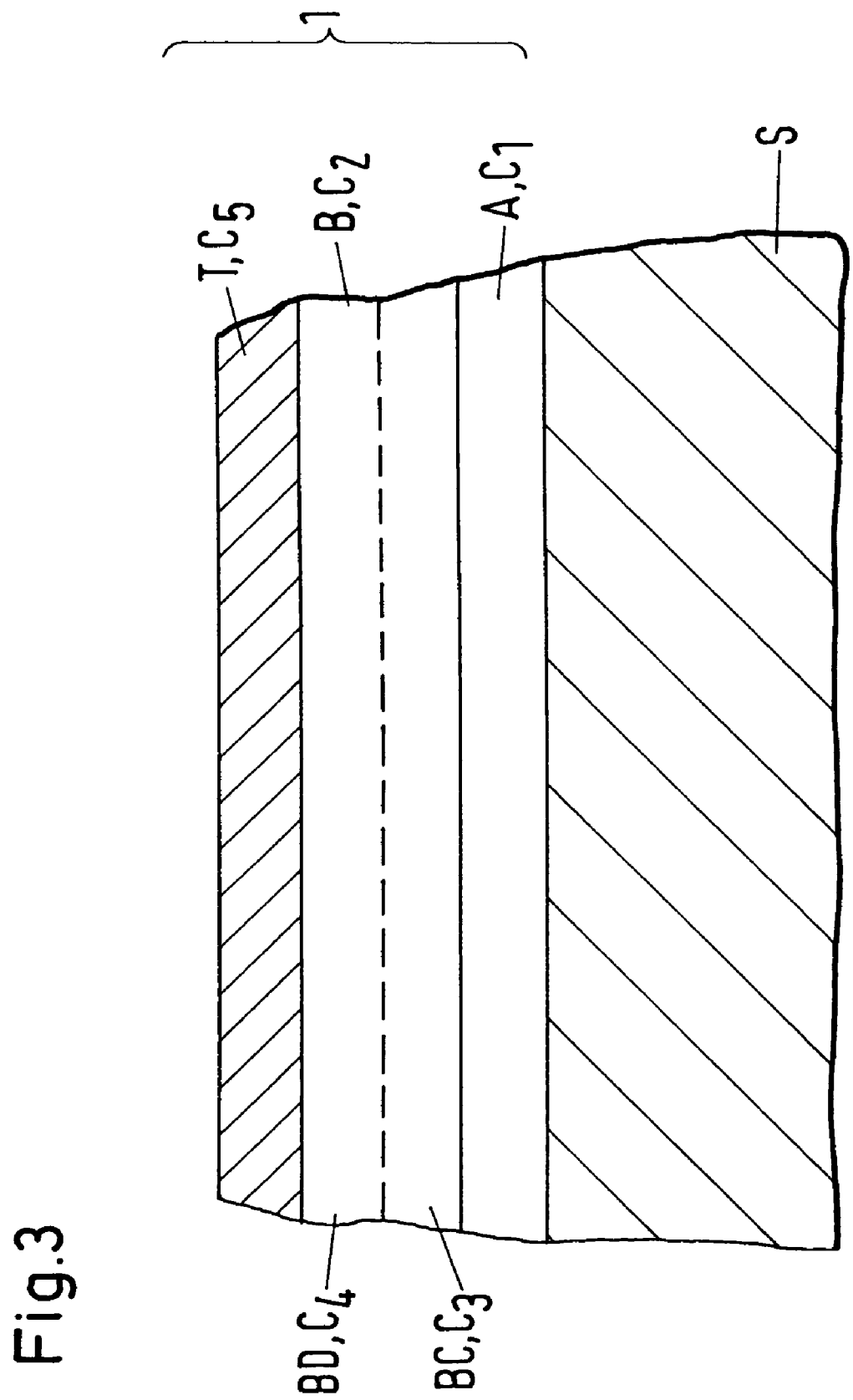
FIG. 3 shows a hard coating with a multi-layer structure and an amorphous-like top-layer.

In FIG. 3, a special embodiment of a hard coating 1 in accordance with the invention is presented having a multi-layer structure including a certain number of layers being coated on a substrate S, wherein the thickness of each layer is at least 2 nm and at the most 2000 nm. Regarding the special embodiment of FIG. 3, the multi-layer structure includes an A-layer A and a B-layer B wherein the A-layer A has a lower atomic concentration C, of carbon than the B-layer B having an atomic concentration $C_2$.

Furthermore, the B-layer B has a multi-layer structure including a C-layer BC and a D-layer BD wherein the C-layer BC has a lower atomic concentration $C_3$ of carbon than the atomic concentration $C_4$ of the D-layer BD, wherein the thickness of the C-layer BC and the D-layer BD is at least 2 nm and at the most 100 nm.

In addition, the hard coating 1 has an amorphous-like top-layer T with an higher atomic concentration $C_5$ of carbon than all other layers. In a special variation, the aforementioned top-layer T includes at least 15% of carbon and at the most 75% of carbon, measured in atomic percent of non-metallic elements included in the hard coating.

Summarizing, the hard coating according to the present invention has a suitable high hardness and is remarkably improved in low residual stress, has excellent strength against flaking-off and shows a high reduction of stress relief of residual compression stress under high temperature with respect to the state of the art.

In addition, the hard coating in accordance with the present invention has also superior anti-oxidation properties due to the fact that the crystal grains are very fine; that is, they are of small size with a characteristic diameter of much less than 50 nm.

It is a new and surprising finding of the invention that an atomic concentration of aluminum greater than 0.4 with respect to the entire metal content in combination with a higher carbon content in the grain boundaries than in the nano-grains themselves results in remarkably improved properties of the hard coating according to the invention, that is, e.g., that the hard coating has improved friction properties and excellent strength against flaking-off. A very low friction coefficient of the coating is achieved because the grain boundaries are highly enriched with carbon resulting in an excellent self-lubricating behavior.

The invention claimed is:

1. A carbon-containing hard coating comprising nano-crystalline grains separated from each other by grain boundaries, said hard coating comprising aluminum, at least one additional metal (Me1, Me2), carbon and at least one further element (E1, E2) and having the chemical composition:

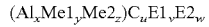
$(Al_xMe1_yMe2_z)C_uE1_vE2_w$ wherein Me1 is a metal and Me2 is a metal and
with $x>0.4$ and $x+y+z=1$ and $y,z \geq 0$ and
with $1>u>0$ and $u+v+w=1$ and $v,w \geq 0$
characterized in that the grain boundaries have a higher concentration of carbon atoms than the nano-crystalline-grains.

2. A hard coating according to claim 1, wherein the full width at half maximum (FWHM) of the carbon Raman-lines (G, D) between 1700 $cm^{-1}$ and 1000 $cm^{-1}$ is less than 150 $cm^{-1}$.

3. A hard coating according to claim 1, wherein the hard coating includes a metal carbo-oxide wherein E1 is oxygen and $v>0$.

4. A hard coating according to claim 1, wherein the hard coating includes a metal carbo-nitride wherein E2 is nitrogen and $w>0$.

5. A hard coating according to claim 1, wherein E1 and/or E2 is an element of the $6^{th}$ or $7^{th}$ main-group of the periodic table of the elements.

6. A hard coating according to claim 1, wherein Me1 and/or Me2 is lithium and/or beryllium and/or an element of the $3^{rd}$ or $4^{th}$ main-group of the periodic table of the elements.

7. A hard coating according to claim 1, wherein Me1 and/or Me2 is a transition metal.

8. A hard coating according to claim 1, wherein the nano-crystalline grains have a cubic structure.

9. A hard coating according to claim 1, wherein the nano-crystalline grains have a hexagonal structure.

10. A hard coating according to claim 1, wherein the grain boundaries are substantially of highly disordered structure.

11. A hard coating according to claim 1, wherein a characteristic diameter of the nano-crystalline grains is greater than 1 nm and less than 50 nm.

12. A hard coating according to claim 1, having a multi-layer structure including at least 2 layers and at the most 2000 layers.

13. A hard coating according to claim 8, wherein the thickness of each layer is at least 2 nm and at the most 2000 nm.

14. A hard coating according to claim 1, having a multi-layer structure including an A-layer (A) and a B-layer (B) wherein the A-layer (A) has a lower atomic concentration of carbon (C) than the B-layer (B).

15. A hard coating according to claim 10, wherein the B-layer has a multi-layer structure including a C-layer (BC) and a D-layer (BD) wherein the C-layer (BC) has a lower atomic concentration of carbon (C) than the D-layer (BD).

16. A hard coating according to claim 11, wherein the thickness of the C-layer (BC) and the D-layer (BD) is at least 2 nm and at the most 100 nm.

17. A hard coating according to claim 1, having at least one layer and one amorphous-like top layer (T) with a higher atomic concentration of carbon (C) than said one layer.

18. A hard coating according to claim 1, wherein the full width at half maximum of the (200) x-ray diffraction peak caused by an (200)-plane is at least 1° and at the most 4° at 2θ.

19. A hard coating according to claim 1, wherein an (200)-intensity (I[200]) of an (200)-peak caused by an (200)-plane, and an (111)-Intensity (I[111]) of the (111)-peak caused by an (111) plane, have a intensity-ratio (I[200]/I[111]) of at least 1 and at the most of 15.

20. A method for depositing a hard coating (1) according to claim 1, wherein said method is a physical vapor-deposition technique.

21. A method for depositing a hard coating (1) according to claim 20, wherein the hard coating (1) is sputtered onto a substrate (S) by using a carbon-containing sputter-target.

22. A method for depositing a hard coating (1) according to claim 20, wherein the hard coating (1) is deposited onto the substrate (S) by using an arc-plasma-deposition technique.

23. A method for depositing a hard coating (1) according to claim 20, wherein the hard coating (1) is deposited onto the substrate (S) by using an electron-beam-evaporation technique.

24. A method for depositing a hard coating (1) according to claim 20, wherein the hard coating (1) is deposited onto the substrate (S) by a chemical-vapor-deposition technique.

25. A method for depositing a hard coating (1) according to claim 20, wherein the hard coating (1) is deposited onto the substrate (S) by a plasma-enhanced-chemical-vapor-deposition technique.

26. A method for depositing a hard coating (1) according to claim 20, wherein the atomic concentration of carbon (C) in the hard coating (1) is controlled by varying the flow rate of an oxygen (O) and/or carbon (C) containing gas in the course of the coating process.

27. A hard coating according to claim 2, wherein the full width at half maximum (FWHM) of the carbon Raman-lines (G, D) between 1700 $cm^{-1}$ and 1000 $cm^{-1}$ is less than 100 $cm^{-1}$.

28. A hard coating according to claim 5, wherein E1 and/or E2 is sulphur and/or fluorine and/or chlorine.

29. A hard coating according to claim 6, wherein Me1 and/or Me2 is boron and/or silicon, or a lanthanide.

30. A hard coating according to claim 7, wherein Me1 and/or Me2 is iron and/or copper and/or chromium and/or manganese and/or scandium and/or yttrium and/or lanthanum and/or molybdenum and/or tungsten and/or titanium and/or tantalum and/or niobium and/or vanadium and/or zirconium and/or hafnium.

31. A hard coating according to claim 9, wherein the nano-crystalline grains have a minor-hexagonal structure.

32. A hard coating according to claim 11, wherein a characteristic diameter of the nano-crystalline grains is greater than 2 nm and less than 10 nm.

33. A hard coating according to claim 18, wherein the full width at half Maximum of the (200) x-ray diffraction peak caused by an (200)-plane is at least 1.2° and at the most 1.9° at 2θ.

34. A hard coating according to claim 11, wherein a characteristic diameter of the nano-crystalline grains is greater than 2 nm and less than 10 nm.

* * * * *